US011944011B2

(12) United States Patent
Feigelson et al.

(10) Patent No.: US 11,944,011 B2
(45) Date of Patent: *Mar. 26, 2024

(54) THERMOELECTRIC NANOCOMPOSITE MATERIALS

(71) Applicant: The Government of the United States of America, as represented by the Secretary of the Navy, Arlington, VA (US)

(72) Inventors: Boris N. Feigelson, Springfield, VA (US); Kevin P. Anderson, Arlington, VA (US); Benjamin L. Greenberg, Alexandria, VA (US); James A. Wollmershauser, Alexandria, VA (US); Alan G. Jacobs, Rockville, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/061,020

(22) Filed: Dec. 2, 2022

(65) Prior Publication Data

US 2023/0180609 A1    Jun. 8, 2023

Related U.S. Application Data

(60) Provisional application No. 63/264,857, filed on Dec. 3, 2021.

(51) Int. Cl.
*H10N 10/01*    (2023.01)
*C04B 35/117*    (2006.01)
(Continued)

(52) U.S. Cl.
CPC ........... *H10N 10/01* (2023.02); *C04B 35/117* (2013.01); *C04B 35/488* (2013.01);
(Continued)

(58) Field of Classification Search
CPC .... H10N 10/857; H10N 10/852; H10N 10/01; C04B 35/117; C04B 35/488;
(Continued)

(56) References Cited

U.S. PATENT DOCUMENTS 10,497,530 B2    12/2019   Feigelson et al.
10,513,462 B2    12/2019   Feigelson et al.
(Continued)

OTHER PUBLICATIONS

Ma, "Core-shell nanostructures introduce multiple potential barriers to enhance energy filtering for the improvement of the thermoelectric properties of SnTe", Nanoscale, 2020, 12, 1904-1911 (Year: 2020).*
(Continued)

*Primary Examiner* — Devina Pillay
(74) *Attorney, Agent, or Firm* — US Naval Research Laboratory; Joslyn J. Barritt

(57) ABSTRACT

Thermoelectric (TE) nanocomposite material that includes at least one component consisting of nanocrystals. A TE nanocomposite material in accordance with the present invention can include, but is not limited to, multiple nanocrystalline structures, nanocrystal networks or partial networks, or multi-component materials, with some components forming connected interpenetrating networks including nanocrystalline networks. The TE nanocomposite material can be in the form of a bulk solid having semiconductor nanocrystallites that form an electrically conductive network within the material. In other embodiments, the TE nanocomposite material can be a nanocomposite thermoelectric material having one network of p-type or n-type semiconductor domains and a low thermal conductivity (Continued)

semiconductor or dielectric network or domains separating the p-type or n-type domains that provides efficient phonon scattering to reduce thermal conductivity while maintaining the electrical properties of the p-type or n-type semiconductor.

20 Claims, 7 Drawing Sheets

(51) Int. Cl.
    *C04B 35/488* (2006.01)
    *C04B 35/626* (2006.01)
    *C04B 35/628* (2006.01)
    *C04B 35/64* (2006.01)
    *C09C 1/28* (2006.01)
    *C09C 3/00* (2006.01)
    *C09C 3/04* (2006.01)
    *C09C 3/06* (2006.01)
    *H10N 10/852* (2023.01)
    *H10N 10/857* (2023.01)

(52) U.S. Cl.
    CPC .... *C04B 35/6261* (2013.01); *C04B 35/62813* (2013.01); *C04B 35/62823* (2013.01); *C04B 35/62884* (2013.01); *C04B 35/64* (2013.01); *C09C 1/28* (2013.01); *C09C 3/006* (2013.01); *C09C 3/041* (2013.01); *C09C 3/043* (2013.01); *C09C 3/063* (2013.01); *H10N 10/852* (2023.02); *H10N 10/857* (2023.02); *C01P 2002/60* (2013.01); *C01P 2002/88* (2013.01); *C01P 2004/64* (2013.01); *C01P 2006/32* (2013.01); *C01P 2006/40* (2013.01); *C04B 2235/3217* (2013.01); *C04B 2235/3244* (2013.01); *C04B 2235/428* (2013.01); *C04B 2235/5445* (2013.01); *C04B 2235/5454* (2013.01); *C04B 2235/614* (2013.01); *C04B 2235/781* (2013.01); *C04B 2235/785* (2013.01); *C04B 2235/9607* (2013.01)

(58) Field of Classification Search
    CPC ........ C04B 35/62813; C04B 35/62823; C04B 35/62884; C04B 35/64; C04B 2235/3217; C04B 2235/3244; C04B 2235/428; C04B 2235/5445; C04B 2235/5454; C04B 2235/9607
    See application file for complete search history.

(56) References Cited

U.S. PATENT DOCUMENTS

| | | |
|---|---|---|
| 10,751,801 B2 | 8/2020 | Feigelson et al. |
| 11,075,049 B2 | 7/2021 | Feigelson et al. |
| 2015/0147590 A1* | 5/2015 | Feigelson ................ B22F 3/12 419/10 |
| 2021/0074991 A1* | 3/2021 | Gaben .................. H01M 4/131 |

OTHER PUBLICATIONS

He, "Current State-of-the-Art in the Interface/Surface Modification of Thermoelectric Materials", Adv. Energy Mater. 2021, 11, 2101877, pp. 1-34, Aug. 2021 (Year: 2021).*

Zhang, "Zr vacancy interfaces: an effective strategy for collaborative optimization of ZrNiSn-based thermoelectric performance", J. Mater. Chem. A, 2019, 7, 26053-26061 (Year: 2019).*

E. Alleno, et al., "Thermal Conductivity Reduction in CoSb3—CeO2 Nanocomposites," Journal of Electronic Materials, vol. 39, No. 9, 2010 DOI: 10.1007/s11664-009-1043-5.

Kwang-Chon Kim, "Precision Interface Engineering of an Atomic Layer in Bulk Bi2Te3 Alloys for High Thermoelectric Performance," ACS Nano 2019, 13, 7146-7154.

* cited by examiner

Nanoparticles

Porous Green Compact

Infilled Compact

Sintered Thermoelectric Nanocomposite

Core/Shell Nanoparticles

Porous Green Compact

Infilled Compact

Sintered Thermoelectric Nanocomposite

Nanoparticles

Core/Shell Nanoparticles

Porous Green Compact

Sintered Thermoelectric Nanocomposite

THERMOELECTRIC NANOCOMPOSITE MATERIALS

CROSS-REFERENCE

This Application is a Nonprovisional of and claims the benefit of priority under 35 U.S.C. § 119 based on U.S. Provisional Patent Application No. 63/264,857 filed on Dec. 3, 2021. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #210910.

TECHNICAL FIELD

The invention is related to a nanostructured thermoelectric material, more particularly to a method for making a thermoelectric nanocomposite material which can be p- or n-type.

BACKGROUND

Practical applications for thermoelectric (TE) materials increase dramatically when such materials have a figure of merit (ZT) above 2. The simplified dimensionless figure of merit for a TE material is quantified by the equation $$ZT = \frac{\sigma S^2 T}{\kappa},$$

where $\sigma$ is the electrical conductivity of the material, S is its Seebeck coefficient, T is its temperature, and $\kappa$ represents the total electronic and lattice contributions ($\kappa_e + \kappa_L$) to the material's thermal conductivity. To date, much of the experimental work in this field has aimed to increase a material's ZT by decreasing its thermal conductivity through incorporation of periodic nanoscale structures that reduce K via phonon scattering and enhance S via selective scattering of lower-energy charge carriers.

However, efforts to improve the ZT of TE materials have been stagnant for decades. Modifications to ZT are difficult largely due to the intrinsic inverse relationship between $\kappa$ and $\sigma$.

Recently, researchers have demonstrated a ZT greater than 2 in a select class of materials consisting of hierarchical microstructures with nano-sized precipitate phases which serve to effectively retard thermal transport without dramatic decay of electrical transport. Although such materials are fabricated with an approach that creatively exploits metallurgical principles in materials science, this approach cannot effectively control or fine-tune the composition, size and phase identities of the nanocrystalline domains.

As such, much of the "high ZT" literature demonstrations are one-shot experiments that explore the properties of a single material with one particular microstructure. Consequently, universal relationships between the performance of TE materials and their nanostructured design are not yet fully understood, and, therefore, cannot be optimized for specific applications.

In general, the thermal conductivity of a given material drops rapidly as its internal microstructural dimensions are reduced. Additionally, interfaces within nanostructured materials—particularly nanocomposites—can serve as energy-dependent scattering sites ("energy filters") that enhance the mobility differential between hot and cold electrons, thereby increasing S. Unfortunately, electrical conductivity of a TE material is often reduced as its thermal conductivity decreases, preventing a useful increase in the material's ZT. On the other hand, in truly nanostructured solids, electrical coupling between different nanostructures (or grains) is determined by the properties of the "linkages" (or grain boundaries) and interfacial structure specifics (coherence, orientation, etc.), which may lead to the formation of three-dimensional conduction bands within the material. Also, shortening of the distances between proximate nanostructures in the material increases the overlap integral between electron wave functions, thus increasing the conductivity. Therefore, the possibility of improving electrical conductivity—and subsequently ZT—through novel approaches to nanostructuring of TE materials is a viable option for boosting their figure of merit.

One approach that has been used to form nanocomposite materials uses the environmentally controlled pressure-assisted sintering (EC-PAS) methodology developed by researchers at the U.S. Naval Research Laboratory, including inventors of the present invention, aspects of which are illustrated by the block schematics in FIGS. 1A and 1B. See U.S. Pat. No. 10,497,530 to Feigelson et al., entitled "Thermionic Tungsten/Scandate Cathodes and Methods of Making the Same"; U.S. Pat. No. 10,513,462 to Feigelson et al., entitled "Transparent Nanocomposite Ceramics Built From Core/Shell Nano Particles"; U.S. Pat. No. 10,751,801 to Feigelson et al., entitled "Bulk Monolithic Nano-Heterostructures and Method of Making The Same"; and U.S. Pat. No. 11,075,049 to Feigelson et al., entitled "Thermionic Tungsten/Scandate Cathodes and Methods of Making the Same." See also U.S. patent application Ser. Nos. 17/951,168 and 17/951,181 by Feigelson et al., entitled "Bipolar Nanocomposite Semiconductors."

As illustrated in FIGS. 1A and 1B, a nanocomposite material can be formed from a starting nanoparticle powder which is cleaned to form an "active" pristine surface. As illustrated in FIG. 1A, in some cases, the particles remain uncoated, while in other cases, such as the case illustrated in FIG. 1B, the cleaned nanoparticles can be coated with another material, e.g., by means of atomic layer deposition (ALD) to form core-shell nanoparticles. In either case, a porous preform is made from the nanoparticles. The porous preform is then sintered at a specified pressure and homologous temperature, e.g., a temperature less than 40% of the absolute melting point $T_m$ in Kelvin or Rankine, to produce a solid that retains the nanostructure of the original nanoparticles but loses the porosity of the preform.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a thermoelectric (TE) nanocomposite material in which control of its charge transport is spatially decoupled from control of its heat transport. By doing so, the present invention enables design of a TE nanocomposite material that combines efficient electronic transport and suppressed thermal transport associated with different nanocomposite constituents.

The present invention provides a TE nanocomposite material that includes at least one component consisting of nanocrystals. A TE nanocomposite material in accordance with the present invention comprises a three-dimensional nanoparticle material network of bonded nanoparticles of a first material having a p- or n-type conductivity embedded within a solid comprising a second material having a thermal conductivity lower than a thermal conductivity of the first material, wherein the nanoparticle material network of the first material retains its nanostructure within the solid material, a p- or n-type network formed by the first material percolates charge through the entire TE material; and the second material provides a level of phonon scattering in the TE nanocomposite material so as to reduce its thermal conductivity while maintaining electrical transport properties provided by the percolating p- or n-type network formed by the first material A TE nanocomposite material in accordance with the present invention can include, but is not limited to, multiple nanocrystalline structures, nanocrystal networks or partial networks, or multi-component materials, with some components forming connected interpenetrating networks including nanocrystalline networks.

In some embodiments, a TE nanocomposite material in accordance with the present invention can be in the form of a thermoelectric composite comprising a bulk solid having semiconductor nanocrystallites as part of the material, where the semiconductor nanocrystallites form an electrically conductive network within the material.

In some embodiments, a TE nanocomposite material in accordance with the present invention can be in the form of a nanocomposite thermoelectric material having one network of p-type or n-type semiconductor domains and a low thermal conductivity semiconductor or dielectric network or domains separating the p-type or n-type domains, where this highly resistive network provides efficient phonon scattering that reduces thermal conductivity and heat transport in the thermoelectric nanocomposite while maintaining the electronic transport in the p-type or n-type semiconductor network, with at least one of the networks comprising 3D, 2D, or 1D nanocrystals/nanocrystallites or possessing at least one nanoscale dimension.

In some embodiments, a TE nanocomposite material in accordance with the present invention comprises a thermoelectric nanocomposite having one network of p- or n-type semiconductor domains and another network of insulator/dielectric domains, with at least one of the networks consisting of 3D, 2D, or 1D nanocrystals/nanocrystallites or having at least one nanoscale dimension.

In some embodiments, a TE nanocomposite material in accordance with the present invention comprises at least one network that includes areas of still another material.

In some embodiments, the nanocrystals/nanocrystallites used in a TE nanocomposite material in accordance with the present invention can range in dimensions from 1 nm to 800 nm.

In some embodiments, at least one nanoscale length dimension of the nanoscale constituents used in a TE nanocomposite material in accordance with the present invention can have this dimension in the range of 1 nm to 800 nm.

In some embodiments, at least one nanoscale length dimension of the constituents used in a TE nanocomposite material in accordance with the present invention can have this dimension less than 1 nm.

In some embodiments, a TE nanocomposite material in accordance with the present invention can comprise strongly electronically coupled nanoscale networks with p- or n-type conductivity.

TE nanocomposite materials in accordance with the present invention include interpenetrating networks of p- or n-type semiconductor domains and at least one another component, typically an insulator or dielectric, which provides efficient phonon scattering behaving as a thermal barrier. Semiconductors responsible for charge transport in TE nanocomposite materials that can be used in accordance with the present invention include, but are not limited to, chalcogenides and their alloys, simple and compound semiconductors and their alloys, and compositions such as SnSe, $Bi_2Te_3$, Bi—Te alloys, BiSbTe alloys, $Bi_2T_3$/CdTe core/shells, Zn—Sb alloys, Si, Ge, SiGe, $Mg_2Si$, $SrTiO_3$, $NaCo_2O_4$, $Zn_4Sb_3$, Co—Sb alloys, and ZnO, while the insulator/dielectrics responsible for reduced thermal transport include insulators or dielectrics such as carbides, oxides, nitrides, fluorides, silicides, phosphides, sulfides, chlorides, and their alloys, including but not limited to SiC, $Al_2O_3$, $ZrO_2$, $HfO_2$, $SiO_2$, $Gd_2Zr_2O_7$, and $(Zr,Hf)_3Y_3O_{12}$, $Si_3N_4$, AlN, ScN, MgF, CaF, ZnF, AlP, $SiS_2$, LiCl, NaCl, $MgCl_2$, $CaCl_2$.

These and other aspects of the invention will be described in more detail below.

DETAILED DESCRIPTION

Figure 1A:
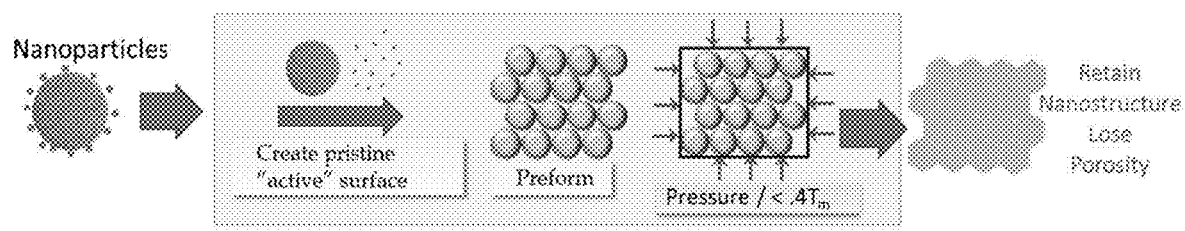
FIGS. 1A and 1B are block schematics illustrating aspects of environmentally controlled pressure-assisted sintering (EC-PAS) formation of materials from nanoparticles in accordance with the prior art.
Figure 1B:
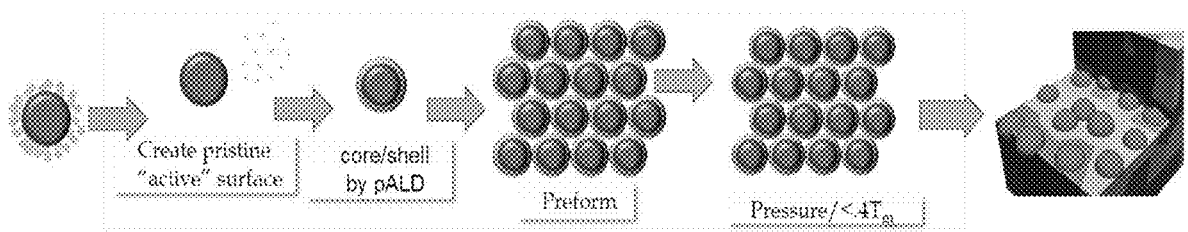

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a thermoelectric (TE) nanocomposite material in which control of its charge transport is spatially decoupled from control of its heat transport. By doing so, the present invention enables design of a TE nanocomposite material that combines efficient electronic transport and suppressed thermal transport associated with different nanocomposite constituents.

The present invention provides a TE nanocomposite material that includes at least one component consisting of nanocrystals. A TE nanocomposite material in accordance with the present invention comprises a three-dimensional nanoparticle material network of bonded nanoparticles of a first material having a p- or n-type conductivity embedded within a solid comprising a second material having a thermal conductivity lower than a thermal conductivity of the first material, wherein the nanoparticle material network of the first material retains its nanostructure within the solid material, a p- or n-type network formed by the first material percolates charge through the entire TE material; and the second material provides a level of phonon scattering in the TE nanocomposite material so as to reduce its thermal conductivity while maintaining electrical transport properties provided by the percolating p- or n-type network formed by the first material A TE nanocomposite material in accordance with the present invention can include, but is not limited to, multiple nanocrystalline structures, nanocrystal networks or partial networks, or multi-component materials, with some components forming connected or percolated interpenetrating networks including non-crystalline and nanocrystalline networks.

In some embodiments, a TE nanocomposite material in accordance with the present invention can be in the form of a thermoelectric composite comprising a bulk solid having semiconductor as part of the material, where the semiconductor forms an electrically conductive network within the material.

In some embodiments, a TE nanocomposite material in accordance with the present invention can be in the form of a nanocomposite thermoelectric material having one network of p-type or n-type semiconductor domains and a low thermal conductivity semiconductor or dielectric network or domains separating the p-type or n-type domains, where this low thermal conductivity network provides efficient phonon scattering that reduces thermal conductivity and heat transport in the thermoelectric nanocomposite while maintaining the electronic transport in the p-type or n-type semiconductor network, with at least one of the networks comprising 3D, 2D, or 1D nanocrystals/nanocrystallites or possessing at least one nanoscale dimension.

In some embodiments, a TE nanocomposite material in accordance with the present invention comprises a thermoelectric nanocomposite having one network of p- or n-type semiconductor domains and another network of insulator/dielectric domains, with at least one of the networks consisting of 3D, 2D, or 1D nanocrystals/nanocrystallites or having at least one nanoscale dimension.

In some embodiments, a TE nanocomposite material in accordance with the present invention comprises at least one network that includes areas of still another material.

In some embodiments, the nanocrystals/nanocrystallites used in a TE nanocomposite material in accordance with the present invention can range in dimensions from 1 nm to 800 nm.

In some embodiments, at least one nanoscale length dimension of the nanoscale constituents used in a TE nanocomposite material in accordance with the present invention can have this dimension in the range of 1 nm to 800 nm.

In some embodiments, at least one nanoscale length dimension of the constituents used in a TE nanocomposite material in accordance with the present invention can have this dimension less than 1 nm.

In some embodiments, a TE nanocomposite material in accordance with the present invention can comprise strongly electronically coupled nanoscale networks with p- or n-type conductivity.

TE nanocomposite materials in accordance with the present invention include interpenetrating networks of p- or n-type semiconductor domains and at least one another component, typically an insulator or dielectric, which provides efficient phonon scattering behaving as a thermal barrier. Semiconductors responsible for charge transport in TE nanocomposite materials that can be used in accordance with the present invention include, but are not limited to, chalcogenides and their alloys, simple and compound semiconductors and their alloys, and compositions such as SnSe, $Bi_2Te_3$, Bi—Te alloys, BiSbTe alloys, $Bi_2T_3/CdTe$ core/shells, Zn—Sb alloys, Si, Ge, SiGe, $Mg_2Si$, $SrTiO_3$, $NaCo_2O_4$, $Zn_4Sb_3$, Co—Sb alloys, and ZnO, while the insulator/dielectrics responsible for reduced thermal transport include insulators or dielectrics such as carbides, oxides, nitrides, fluorides, silicides, phosphides, sulfides, chlorides, and their alloys, including but not limited to SiC, $Al_2O_3$, $ZrO_2$, $HfO_2$, $SiO_2$, $Gd_2Zr_2O_7$, and $(Zr,Hf)_3Y_3O_{12}$, $Si_3N_4$, AlN, ScN, MgF, CaF, ZnF, AlP, $SiS_2$, LiCl, NaCl, $MgCl_2$, $CaCl_2$. It will be noted that one skilled in the art will readily recognize that the listed materials are exemplary only, and that other suitable materials can be used, and TE nanocomposite materials made from such other suitable materials are deemed to be within the scope of the present invention.

These and other aspects of this invention can be accomplished by the new process of making a thermoelectric nanocomposite described in detail in the disclosure of this invention.

The TE nanocomposite materials of the present invention can be made by the processes described below. In accordance with the present invention, these processes include several steps described herein, with each step of the process being a preferred part, and all steps taken together make the process sufficient to produce a TE nanocomposite material having the desired properties. To provide clean interfaces between all constituents of the synthesized TE nanocomposite material, all processing steps are preferred to be conducted in a controlled atmosphere and with air-free transfer between steps.

It should be noted, however, that the described processes are merely exemplary, and that other suitable processes for making a TE nanocomposite material in accordance with the present invention can be used, and all suitable processes and TE nanocomposite materials made from such processes are deemed to be within the scope of the present invention.

Figure 2:
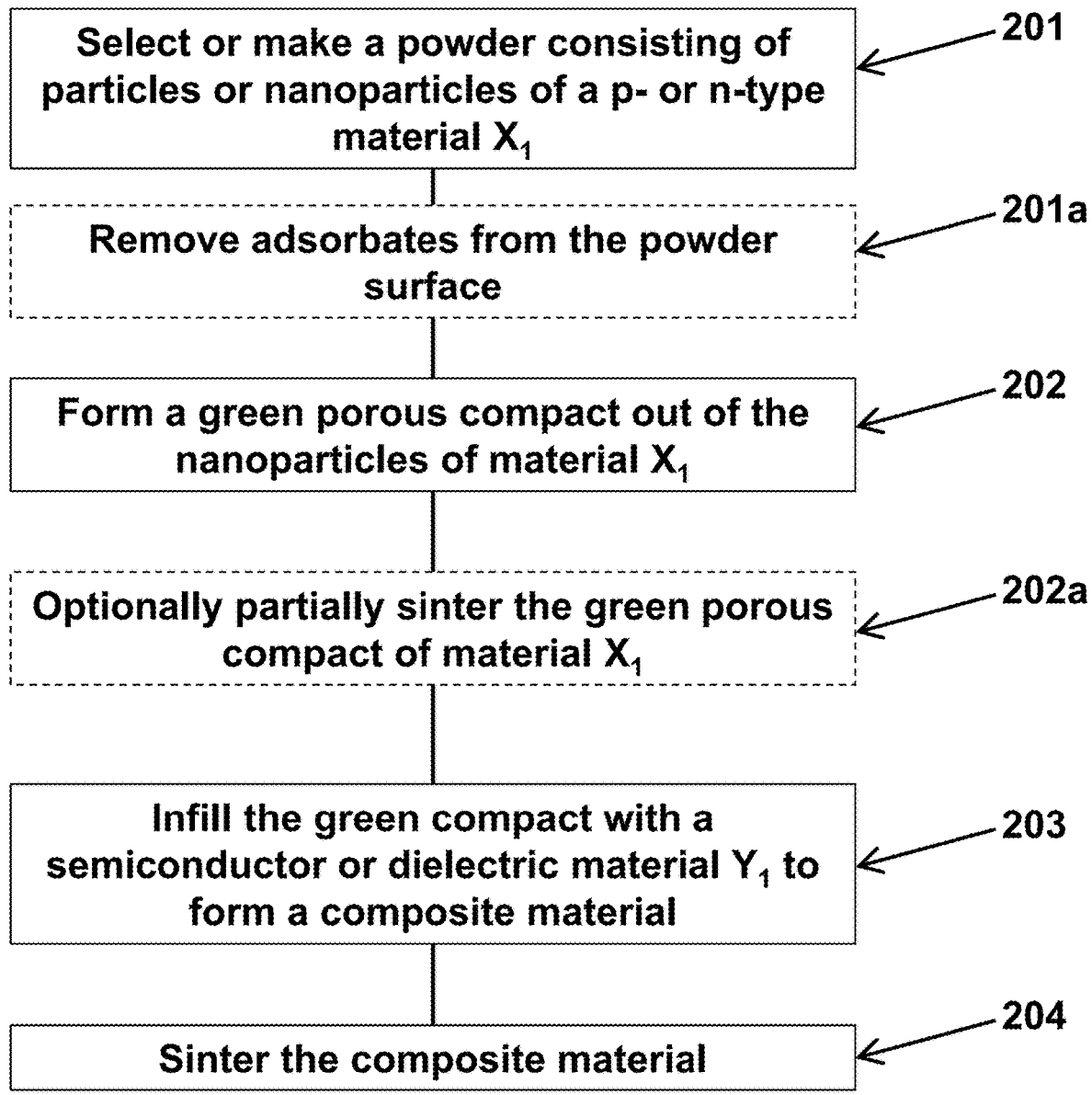
FIG. 2 is a block schematic illustrating aspects of an exemplary process flow for forming a thermoelectric (TE) nanocomposite material in accordance with one or more embodiments of the present invention.

The flow diagram in FIG. 2 and the block schematics in FIGS. 3A-3D, 4A-4D, 5A-5D, and 6A-6D illustrate aspects of the process steps used in various exemplary embodiments of processes for making a TE nanocomposite material in accordance with the present invention. The basic process steps in each of the embodiments described below are the same, and so will not be repeated in the description of each embodiment for the sake of brevity, with only the process steps that are different from those in other embodiments being described in detail. For example, in the description of the second embodiment of a method for making a TE nanocomposite material in accordance with the present invention, Steps I, II, and IV proceed as described with respect to the first embodiment, with only Step III being described in detail.

Figure 3A:
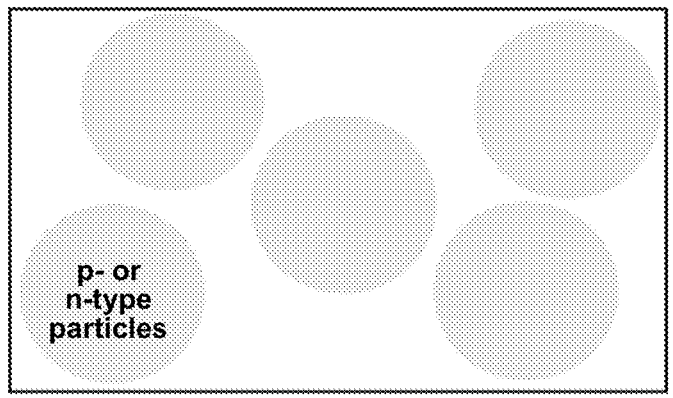
FIGS. 3A-3D are block schematics illustrating aspects of forming, infilling and sintering a porous compact of nanoparticles to form a TE nanocomposite material in accordance with one or more embodiments of the present invention.

Thus, as shown as Step 201 in FIG. 2 and as schematically illustrated in FIG. 3A, Step I in an exemplary first embodiment of this process includes selecting or making a powder consisting of particles or/and nanoparticles of a p- or n-type semiconductor material $X_1$, which mainly controls the electronic transport properties of a TE material. The powder of the semiconductor material can be made by any suitable technique such as ball milling, laser ablation, precipitation from solution, or hydrothermal and/or ammonothermal synthesis. In many embodiments, the powder will be a nanopowder comprising nanoparticles having a particle size of about 1 nm to about 800 nm. In some embodiments a particle size can be larger than 800 nm.

In an optional step 201a, adsorbates such as water or oxides from the powder surface can also be removed in this Step I before proceeding to the next steps. This surface cleaning step can be accomplished by any suitable technique, though it is preferred that the cleaning is conducted in a furnace at elevated temperatures in a controlled atmosphere. Oxide removal can be conducted chemically or at elevated temperatures by reduction in an atmosphere with hydrogen.

Figure 3B:
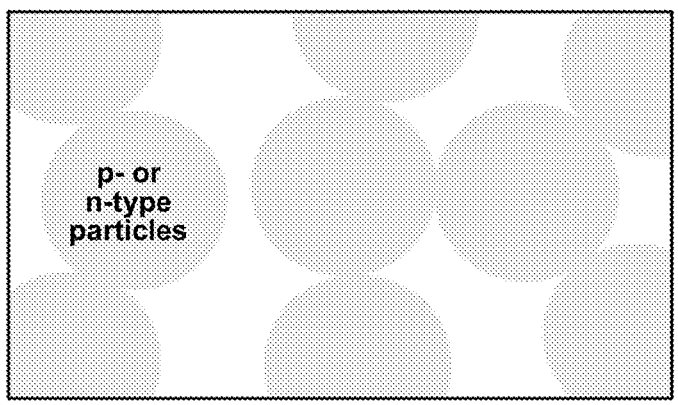

In Step II of the process for making a TE nanocomposite material in accordance with the present invention, shown as Step 202 in FIG. 2 and in FIG. 3B, the powder of material $X_1$ is formed into a porous compact, creating a particle or nanoparticle interconnected network having an open porosity that permits a gas or a liquid to permeate the compact.

The porous compact made in this Step can be made by any existing technique such as techniques involving assembling or growing blocks of a porous compact or techniques making pores in existing material. In some cases, the compact can be made by pressing the powder of material $X_1$ in the container or die to form what is usually called a green compact. In other embodiments, the porous compact can be made by sintering the loose nanoparticle powder such that particles neck without densification and form strong chemical or metallic bonds with each other.

In an optional step 202a shown in FIG. 2, the green porous compact of material $X_1$ can be partially sintered while preserving an open porosity and making strong chemical or metallic bonds between particles.

Figure 3C:
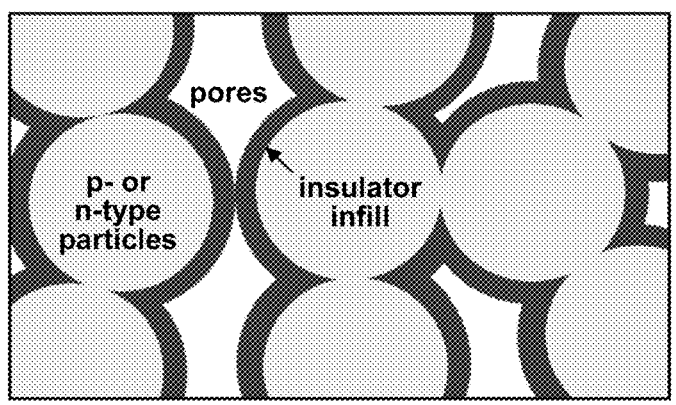
Figure 3D:
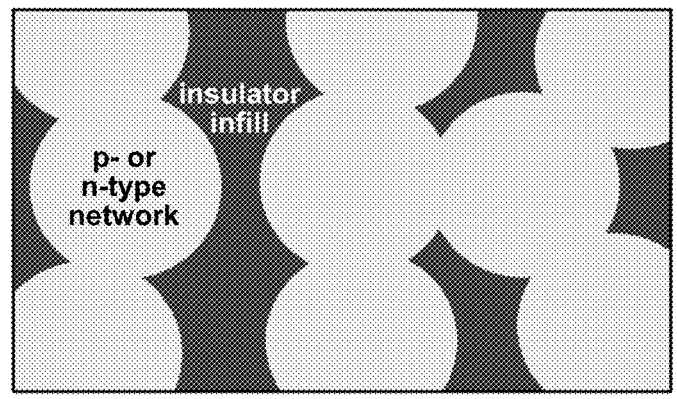

In Step III of the process for making a TE nanocomposite material in accordance with the present invention, shown as Step 203 in FIG. 2 and schematically in FIG. 3C, the porous compact of material $X_1$, which initially has a form similar to that shown by the schematic in FIG. 3B, is infilled with a second material which is intended to minimize thermal transport in the TE material by increasing phonon scattering. In some embodiments, this second material $Y_1$ can be the same semiconductor material as $X_1$, while in other embodiments, the second material $Y_1$ can be a different semiconductor material or an insulator/dielectric material, as shown in as shown in FIG. 3C and FIG. 6A, so long as this second material $Y_1$ provides efficient phonon scattering in the final TE nanocomposite material so as to reduce its thermal conductivity while maintaining or improving electrical transport properties provided by p- or n-type material $X_1$.

Figure 6A:
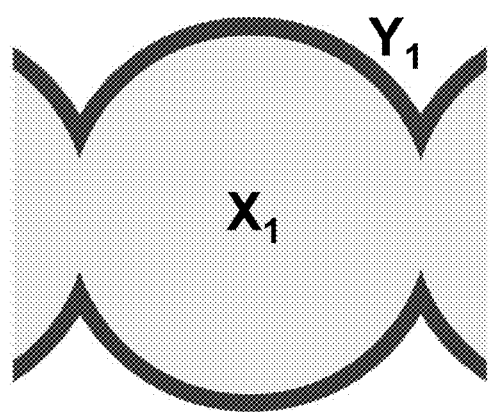
FIGS. 6A-6D are block schematics are block schematics illustrating three-particle fragments of exemplary porous compacts after infilling but before sintering according to various embodiments of the methods for making a TE nanocomposite material in accordance with one or more embodiments of the present invention.
Figure 6B:
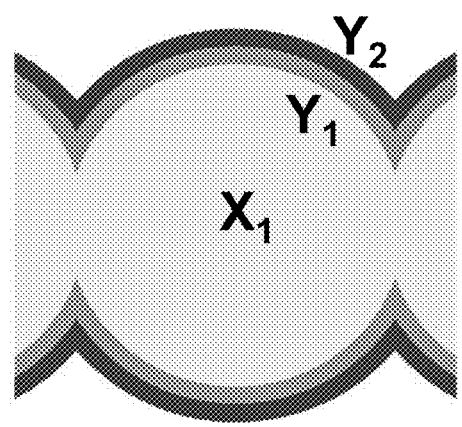
Figure 6C:
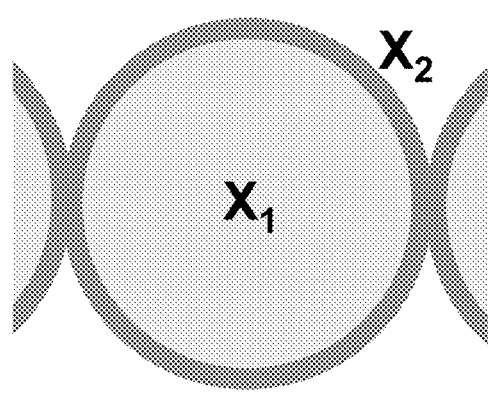

During this infilling step, a continuous or discontinuous conformal layer of the second material $Y_1$ i is applied to partially or completely coat all available surfaces in the pores inside the $X_1$ compact, as illustrated by the schematics in FIGS. 3C and 6A, to form a composite material consisting of a p- or n-type semiconductor network provided by material $X_1$ and the second material $Y_1$.

Infilling the porous compact and conformally coating the all available surfaces of $X_1$ with this second material requires precise control of the nanoscale thickness and/or of the amount and uniform distribution of the deposited second material $Y_1$ on the surfaces of $X_1$. While atomic layer deposition (ALD) may often be the preferred technique for infilling and depositing the second material $Y_1$ on the surfaces of $X_1$, this infilling/depositing step can be performed by any available technique for thin film deposition, such as chemical vapor deposition (CVD), atomic layer deposition (ALD), electro-chemical deposition, chemical deposition from solution, etc., or infilling by infiltration by melt, from liquid solution, etc.

Finally, in Step IV (shown as Step 204 in FIG. 2 and schematically in FIG. 3D), the composite material formed in Step III is sintered to remove residual porosity from the composite material so as to form a solid having an intimately connected percolated p- or n-type network of $X_1$ and a separate network of $Y_1$ bonded to $X_1$, and having strong chemical bonds at all interfaces between materials $X_1$ and $Y_1$. While in some cases, the sintering process can result in a material having at least some residual porosity, the sintering process should be conducted in a manner that preserves the intended structure of the composite and maintains a p- or n-type semiconductor network $X_1$ that percolates charge within the solid semiconductor/insulator/dielectric material $Y_1$. The final result is a TE nanocomposite solid comprising at least one component at nanoscale such as that illustrated by the block schematic in FIGS. 3D and 6A and having a p- or n-type network formed by semiconductor material $X_1$ which percolates charge through a solid formed from semiconductor/insulator/dielectric material $Y_1$, where $Y_1$ provides efficient phonon scattering in the final TE nanocomposite material so as to reduce its thermal conductivity while maintaining or improving electrical transport properties provided by the p- or n-type material $X_1$.

This sintering step can occur either inside or outside the deposition chamber, so long as any transfer of the material outside the deposition chamber is preferred to be conducted in a controlled atmosphere and with air-free transfer so as to provide clean interfaces within the thermoelectric nanocomposite.

Before the sintering step the material after the deposition can be annealed in the deposition chamber or in a furnace to remove any unwanted species, and then can be sintered either inside or outside the deposition chamber or the furnace, with any transfer of the material outside the deposition chamber or the furnace is preferably being conducted in a controlled atmosphere and with air-free transfer so as to provide clean interfaces within the thermoelectric nanocomposite.

In a second embodiment of a process for making a TE nanocomposite material in accordance with the present invention, Steps I, II, and IV proceed as described above with respect to the first embodiment. In Step III of this second embodiment, the process of infilling and conformally coating all available surfaces inside the porous compact of material $X_1$ with a material $Y_1$ is interrupted while the compact retains an open porosity, and the step of infilling is repeated with a second metal/semiconductor/insulator/dielectric material $Y_2$, as illustrated by the block schematic shown in FIG. 6B.

Material $Y_1$ can coat all available surfaces partially or completely and material $Y_2$ can also coat all available surfaces partially or completely. $Y_1$ and $Y_2$ can be metal or semiconductor, or dielectric as long as their combination will suppress thermal transport in the final TE nanocomposite material.

In a third embodiment of the process for making a TE nanocomposite material in accordance with the present invention, Steps I and II also proceed as described above with respect to the first embodiment, but in this third embodiment, Step III of infilling and conformally coating all available surfaces inside the porous compact of material $X_1$ with a material $Y_1$ is interrupted while the compact retains an open porosity, with the steps of infilling being repeated with materials $Y_2, Y_3, \ldots, Y_{N-1}$ and finally with material $Y_N$, where materials $Y_1, Y_2, Y_3, \ldots Y_N$ can be the same or different and can be any materials including semiconductors, metals, or insulators, with the choice of material(s) being determined by the desired properties and application of the final TE material.

Materials $Y_1, Y_2, Y_3, \ldots Y_N$ can coat all available surfaces partially or completely.

Figure 4A:
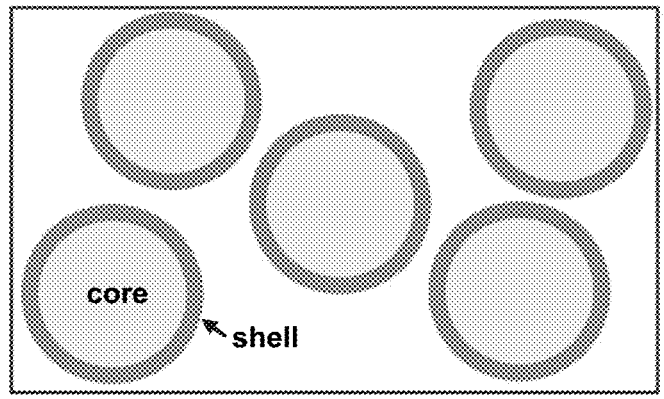
FIGS. 4A-4D are block schematics illustrating aspects of forming, infilling and sintering a porous compact of core/shell nanoparticles to form a TE nanocomposite material in accordance with one or more other embodiments of the present invention.

In a fourth embodiment of a process for making a TE nanocomposite material in accordance with the present invention, aspects of which are illustrated in FIGS. 4A-4D and 6C, Steps I, II, and IV proceed as described above with respect to the first embodiment, except that instead of single-material particles or nanoparticles, the starting material comprises core/shell nanoparticles having a core of material $X_1$ and a shell of material $X_2$, as illustrated by the schematic in FIG. 4A.

The material $X_2$ shell can be a continuous film as shown in FIG. 4A or can be a discontinuous film comprising separate or non-separate islands, nanoparticles or nanocrystals which can percolate or not percolate on the surface of particle $X_1$. Material $X_2$ can be any material including semiconductors, metals and dielectrics depending on design of the TE material.

Figure 4B:
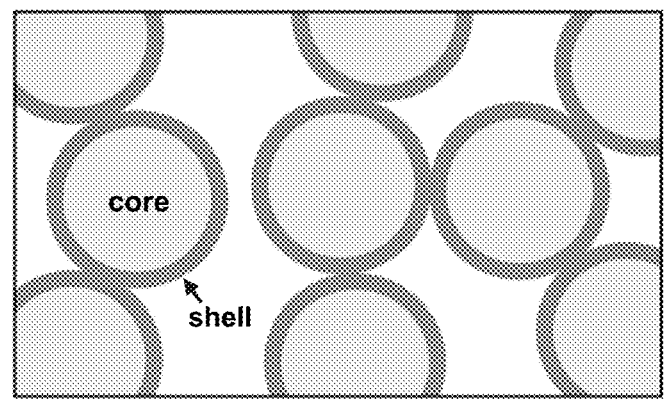
Figure 4C:
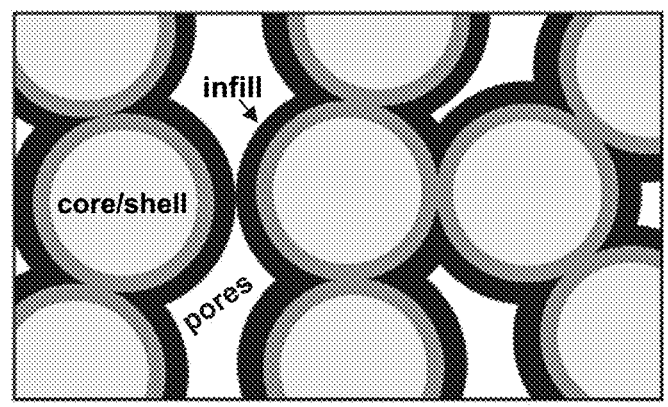
Figure 6D:
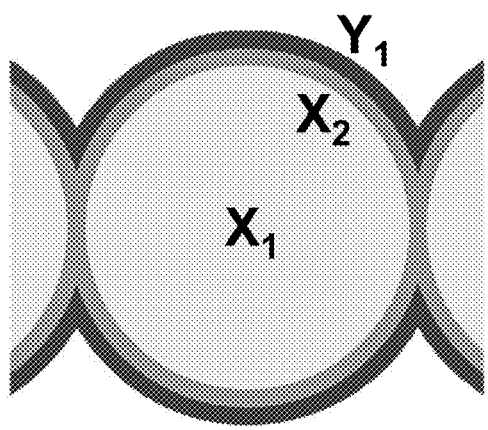

As illustrated in FIG. 4B, these $X_1/X_2$ core/shell nanoparticles are then formed into a porous green compact, and are then infilled with an material $Y_1$ suppressing heat transport as illustrated in FIGS. 4C and 6D, which is made to conformally coat, partially or completely, all available surfaces in the $X_1/X_2$ core/shell green compact.

Figure 4D:
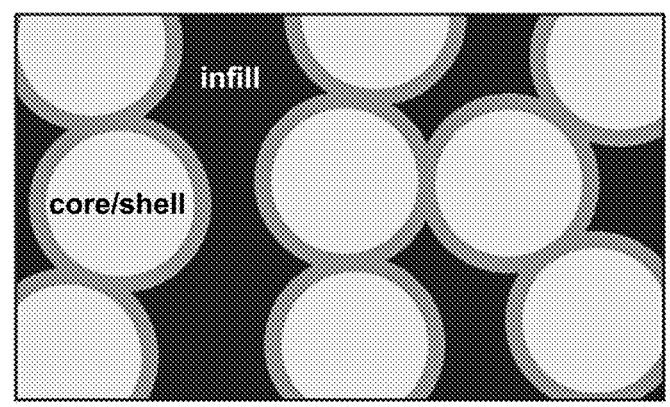
Figure 5A:
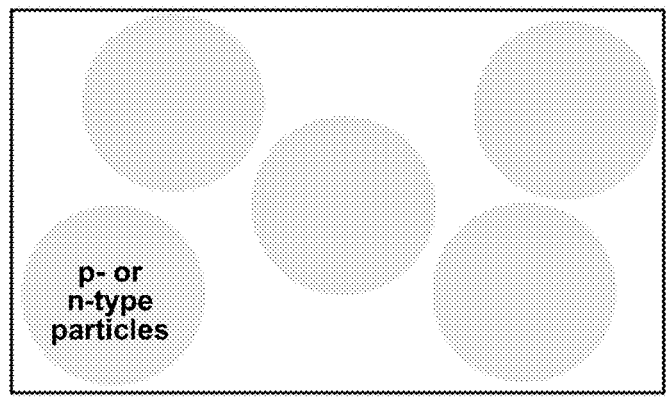
FIGS. 5A-5D are block schematics illustrating aspects of forming and sintering a porous compact of core/shell nanoparticles to form a TE nanocomposite material in accordance with one or more embodiments of the present invention.
Figure 5B:
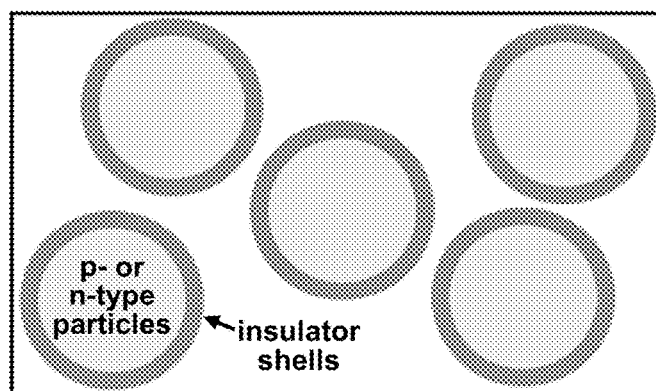
Figure 5C:
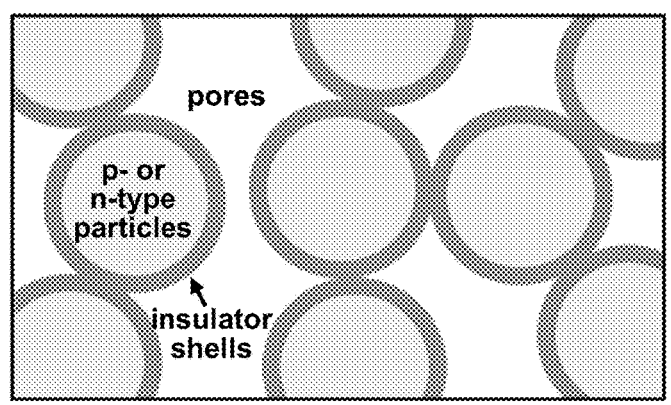
Figure 5D:
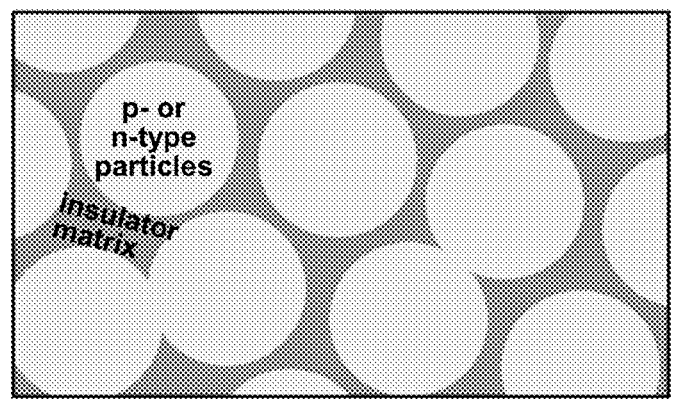

The infilled compact is then sintered (step IV), as illustrated in FIG. 4D, to form a solid TE material in which the initial core/shell $X_1/X_2$ particles percolate through a $Y_1$ matrix, where $Y_1$ provides efficient phonon scattering in the final TE nanocomposite material so as to reduce its thermal conductivity while maintaining the electrical properties provided by p- or n-type materials $X_1$ or/and $X_2$.

In a fifth embodiment of a process for making a TE nanocomposite material in accordance with the present invention, the process of infilling and conformally coating all available surfaces inside the porous compact of material $X_1/X_2$ with a material $Y_1$ (semiconductor, metal, dielectric, etc.) is interrupted while the compact retains an open porosity and the step of infilling is repeated with a material $Y_2$, where materials $Y_1$ and $Y_2$ can be any materials including semiconductors, metals and dielectrics, with the choice of material(s) being determined by the desired properties and application of the final TE nanocomposite material. In an exemplary embodiment, material $Y_1$ can be $ZrO_2$ and material $Y_2$ can be ZnO.

In a sixth embodiment of a process for making a TE nanocomposite material in accordance with the present invention, the process of infilling and conformally coating all available surfaces inside the porous compact of the material $X_1/X_2$ is repeated with materials $Y_1, Y_2, \ldots, Y_{N-1}$ while the compact retains an open porosity for the final infilling step with material $Y_N$. Any one or more of materials $Y_1, Y_2, Y_3, \ldots Y_N$ can be any materials including semiconductors, metals and dielectrics, with the choice of material(s) being determined by the desired properties and application of the final TE material.

In a seventh embodiment of a process for making a TE nanocomposite material in accordance with the present invention, the starting powder consists of core/shell nanoparticles having a structure $X_1/X_2/\ldots/X_N$ where material $X_1$ is the core, $X_2 \ldots X_{N-1}$ are intermediate continuous or discontinuous layers, and $X_N$ is the outer continuous or discontinuous shell, where $X_1, X_2, \ldots X_N$ can be any materials including semiconductors, metals and dielectrics/insulators with at least one a semiconductor which has p- or n-type conductivity providing charge transport through the final TE material. The materials choices depend on the desired properties and application of the final TE material. For example, in some cases $X_N$ can be very thin insulator, while $X_{N-1}$ is semiconductor, with electrons from $X_{N-1}$ tunneling through the $X_N$ shell in the final product. In another example $X_N$ can be islands of insulator letting parts $X_{N-1}$ semiconductor of one particle to be in a direct contact with $X_{N-1}$ semiconductor of another particle when they will be used to make porous compact. Yet, in another example $X_N$ can be islands of a metal letting parts $X_{N-1}$ semiconductor of one particle to be in a direct contact with $X_{N-1}$ semiconductor of another particle when they will be used to make porous compact.

Thus, Step I in this seventh embodiment includes the step of making or selecting nanopowder consisting of $X_1/X_2/\ldots/X_N$ core/shell nanoparticles where material $X_N$ is an outer shell.

In Step II of this seventh embodiment, the $X_1/X_2/\ldots/X_N$ core/shell nanopowder of the material is formed into a porous compact, creating a core/shell particle or nanoparticle network having an open porosity as described above with respect to the first embodiment.

In Step III of this seventh embodiment, the porous compact of the $X_1/X_2/\ldots/X_N$ material is infilled with a material $Y_1$. In some embodiments, $Y_1$ can be the same semiconductor material as $X_N$, while in other embodiments, $Y_1$ can be a different semiconductor material or an insulator/dielectric material, so long as the addition of $Y_1$ increases phonon scattering in the final TE nanocomposite material so as to reduce its thermal conductivity while minimally affecting the electrical transport provided by p- or n-type $X_1/X_2/\ldots/X_N$. During this infilling step, the $Y_1$ material is made to conformally and completely or incompletely coat all available surfaces inside the compact formed from the $X_1/X_2/\ldots/X_N$ nanoparticles using any suitable technique, e.g., atomic layer deposition (ALD), with the result being a composite material comprising percolated $X_1/X_2/\ldots/X_N$ network and $Y_1$ network or domains. This composite material can then be sintered as in Step IV of the process described above to form the final TE material with charge transport provided by the initial $X_1/X_2/\ldots/X_N$ core/shell particles which percolate charge through a solid formed from $X_1/X_2/\ldots/X_N$ and material $Y_1$, where $Y_1$ increases phonon scattering in the final TE nanocomposite material so as to reduce its thermal conductivity while maintaining or improving electrical transport properties provided by the p- or n-type $X_1/X_2/\ldots/X_N$ structure.

In an eighth embodiment of a process for making a TE nanocomposite material in accordance with the present invention, the process of infilling and conformally partially or completely coating all available surfaces inside the porous compact of material $X_1/X_2/\ldots/X_N$ with a material $Y_1$ is interrupted while the compact retains an open porosity and the step of infilling is repeated with a material $Y_2$, where materials $Y_1$ and $Y_2$ can be any materials including semiconductors, metals and dielectrics, with the choice of material(s) being determined by the desired properties and application of the final TE nanocomposite material.

In a ninth embodiment of a process for making a TE nanocomposite material in accordance with the present invention, the process of infilling and conformally coating all available surfaces inside the porous compact of the material $X_1/X_2/\ldots/X_N$ in Step III is repeated with any materials $Y_1, Y_2, \ldots, Y_{N-1}$ including metal/semiconductor/insulator/dielectric to have a multiple coatings on the surfaces while the compact retains an open porosity for the final infilling step with material $Y_N$. Any $Y_1, Y_2, \ldots, Y_N$ material can partially or completely coat all available surfaces.

In Step IV of this embodiment, the formed composite material is sintered in order to remove residual porosity and form a solid with intimately connected p- or n-type networks and having strong chemical bonds at all interfaces between materials. In some cases, the sintering process can result in a material having some porosity. The sintering process should be conducted in a manner that preserves the intended structure of the composite with p- or n-type semiconductor networks that percolate charge and results in a solid thermoelectric material that has no porosity while retaining the original nanoscale structure. The final TE nanocomposite material has a p- or n-type network formed by $X_1/X_2/\ldots/X_N$ which percolates through a solid formed from $X_1/X_2/\ldots/X_N$ and $Y_1, Y_2, \ldots, Y_{N-1}, Y_N$ materials, where the combination of $Y_1, Y_2, \ldots, Y_{N-1}, Y_N$ materials increase phonon scattering, thereby suppressing heat transport while maintaining or improving electronic transport provided by p- or n-type $X_1/X_2/\ldots/X_N$ material structure, e.g., by increasing the Seebeck coefficient of the TE material.

In some cases of the first three embodiments of a process for making a TE nanocomposite material described above, $X_1$ can be an insulator or a semiconductor and $Y_1, Y_2, \ldots, Y_{N-1}, Y_N$ can be any materials including semiconductors, metals and dielectrics/insulators, with at least one $Y_1, Y_2, \ldots, Y_{N-1}, Y_N$ material being a semiconductor which has p- or n-type conductivity providing charge transport through the final TE material, with $X_1$ enhancing phonon scattering in the final TE nanocomposite material to reduce its thermal conductivity while maintaining or improving electronic transport properties provided by p- or n-type $Y_1, Y_2, \ldots, Y_{N-1}, Y_N$ material.

In some cases of the fourth to ninth embodiments described above, materials $X_1/\ldots/X_N$ can be any materials such as a metal, a semiconductor or a dielectric leading to increased phonon scattering in the final TE nanocomposite material and reduction of its thermal conductivity, while maintaining or improving electronic transport properties provided by p- or n-type $Y_1, Y_2, \ldots, Y_{N-1}, Y_N$ material. $Y_1 \ldots Y_N$ can be any material, with at least one is a p- or n-type semiconductor forming a percolated network of charge transport throughout the entire thermoelectric material.

In some embodiments, a TE nanocomposite material in accordance with the present invention can be made from one or more types of nanoparticles A, B, etc., at least one of them having n- or p-type conductivity, where the nanoparticles are sintered as described in the previous embodiments, to form a solid in which at least one type of the particles with n- or p-type conductivity forming a percolated network of charge transport throughout the entire material, while other nanoparticles suppress the heat transport.

In some such embodiments, one or more of nanoparticles A, B, etc., can be core/shell nanoparticles having one or more shell, and where the nanoparticles are sintered to form a solid having at least one percolation path or network with p- or n-type conductivity throughout the entire material. For example, FIGS. 5A-5D show shows exemplary steps for making TE nanocomposite material in the case of one core/shell nanoparticle A with one shell.

In all of these embodiments, a TE nanocomposite solid can be obtained, where the TE nanocomposite solid that contains interpenetrating three-dimensional p-type or n-type networks that percolate throughout the solid. Band-like transport of electrons or holes across the entire TE solid is ensured by sufficiently large cross-sectional areas of the conductive n-type or p-type channels; the former are achieved through the sintering process and through the heavy doping of the p-type or n-type networks.

These and other suitable configurations of TE materials would be readily understood to be possible by one skilled in the art are all deemed to be within the scope and spirit of the present invention.

Example

In this example, a thermoelectric nanocomposites made from p-type silicon (Si) nanopowder with aluminum oxide ($Al_2O_3$) and p-type silicon (Si) nanopowder with zirconium oxide ($ZrO_2$) made in accordance with the first embodiment are demonstrated.

Si nanopowder with p-type conductivity is made by high-energy milling in pure argon of Si bulk material doped with boron, having resistivity of about 0.001-0.005 ohm·cm. The resulting average crystallite size of the milled nanopowder is 30 nm.

The nanopowder is annealed at 450° C. for 2 hours in pure argon to remove moisture and other adsorbates from the powder surface.

After cleaning, the powder is transferred to a glovebox (GB) without exposure to air. Inside the GB the powder is compacted into a cylindrical shape 10 millimeters in diameter and 1 millimeter in height. The same procedure was repeated to make the second compact. Both compacts are transferred to a furnace without exposure to air and pre-sintered at 1000° C. for 5 minutes in pure argon. After pre-sintering, compacts have 45% porosity.

Following the pre-sintering, one compact is transferred to an ALD reactor in which an amorphous $Al_2O_3$ coating approximately 0.75 nm in thickness is deposited on all Si surfaces inside the pores. The $Al_2O_3$ coating is deposited via ALD at 180° C. using TMA as the Al precursor and water as the oxidant.

Following the pre-sintering, another compact is transferred to an ALD reactor in which a $ZrO_2$ coating approximately 0.75 nm in thickness is deposited on all Si surfaces inside the pores. The $ZrO_2$ coating is deposited via ALD at 180° C. using TDMAZ as the Zr precursor and water as the oxidant.

After the ALD step the formed composite material is sintered under a pressure of 1.0 GPa and temperature of 900° C. in order to remove residual porosity and form a solid with intimately connected p-type Si domains surrounded with $Al_2O_3$ or $ZrO_2$ and strong chemical bonds at all interfaces.

The resulting materials represents a thermoelectric nanocomposite solids with percolating p-type semiconductor and insulator efficiently scattering phonons and providing low thermal conductivity.

Figure 7:
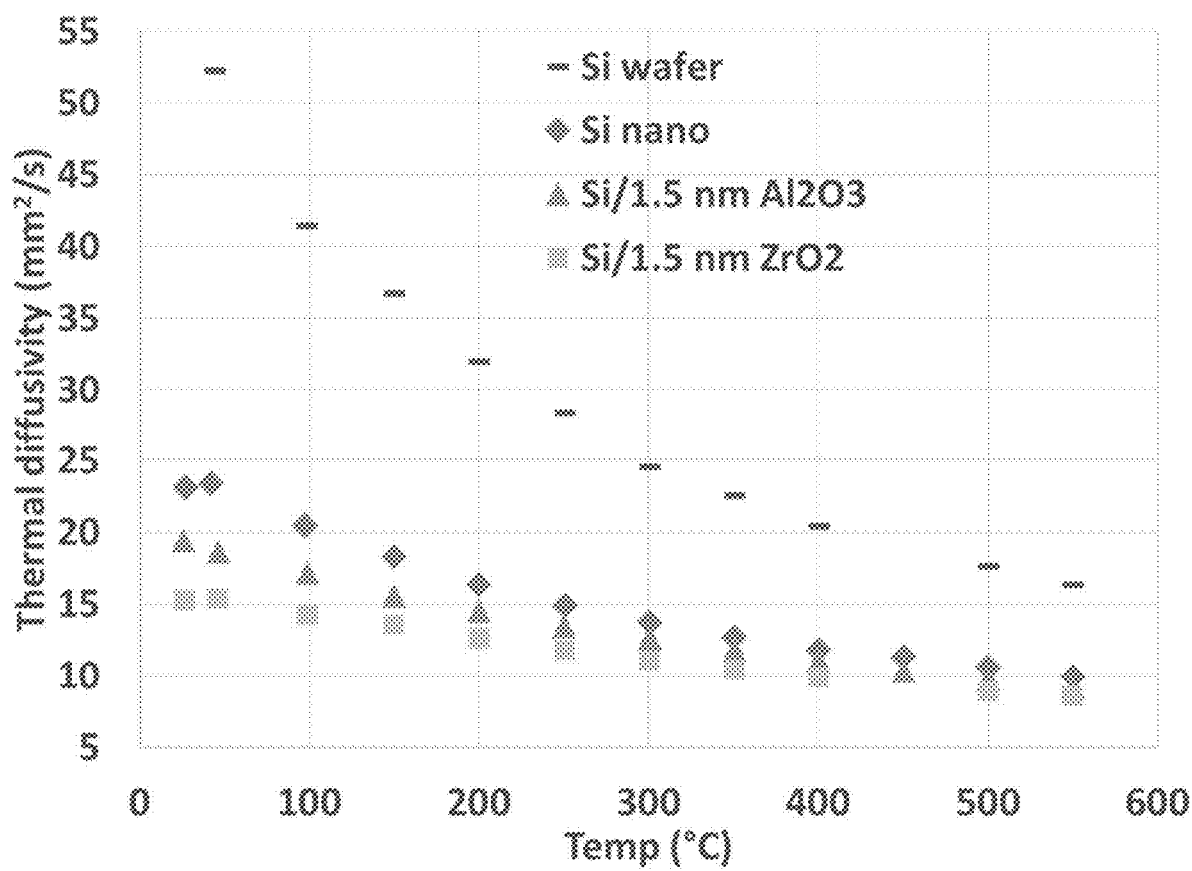
FIG. 7 is a plot illustrating the advantageous performance of TE materials formed in accordance with the present invention.

Thermal transport properties of these TE nanocomposite solids are compared with each other and with bulk Si and nanocrystalline Si. Plots of thermal conductivity are shown in FIG. 7. Thermal conductivity of pure Si is substantially dropped in nanocrystalline Si when compared with bulk Si. It is a clear indication of enhanced phonon scattering on grain boundaries. Addition of very thin oxide films to the nanocomposites further reduced thermal conductivity (k) which leads to improved figure of merit ZT of thermoelectric material following the formula $$ZT = \frac{\sigma S^2 T}{\kappa}.$$

Thus, the present disclosure describes various embodiments of a thermoelectric nanocomposite material comprising p- or n-type semiconductor nanoparticles of a material X in an insulator/dielectric matrix of a material Y, where the insulator/dielectric material Y provides efficient phonon scattering so as to reduce the final TE material's thermal conductivity while maintaining or improving the electrical transport properties provided by the p- or n-type material X.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for forming a thermoelectric (TE) nanocomposite material, the method including steps of:
    making or selecting a first material comprising a nanopowder of n- or p-type semiconductor nanoparticles or of $X_1/X_2 \ldots X_N$ n~ or p~type semiconductor core/shell nanoparticles, where $X_1$ is a core of the nanoparticles and $X_2/\ldots X_N$ are shells surrounding the core wherein, $-X_2 \ldots X_{N-1}$ are intermediate continuous or discontinuous layers, each shell surrounding a shell preceding it, and $X_N$ is an outer continuous or discontinuous shell;
    making a porous green compact consisting of an interconnected particle network from the first material, the compact having an open porosity allowing permeation of the compact with gas or liquid;
    infilling and coating all available surfaces inside the porous compact formed from the first material with at least one second material $Y_1, Y_2, \ldots Y_N$ to form a composite material of the first and second materials, at least one second material $Y_1, Y_2, \ldots Y_N$ being a semiconductor or a dielectric/insulator material and having a thermal conductivity lower than a thermal conductivity of the first material; and
    sintering the formed nanocomposite material to remove residual porosity from the composite material and form a nanocomposite solid material with intimately connected p- or n-type networks and having strong chemical bonds at all interfaces;
    wherein the nanocomposite solid material retains the nanostructure of the starting nanoparticles within the solid;
    wherein the nanocomposite solid material maintains a percolating p- or n-type semiconductor network of the first material $X_1/X_2 \ldots X_N$ within the solid second material; and
    wherein the second material provides efficient phonon scattering so as to reduce a thermal conductivity of the nanocomposite material while maintaining electrical transport properties of the first material network.

2. The method according to claim 1, wherein the first material comprises single-material nanoparticles.

3. The method according to claim 1, wherein one or more of the $X_2 \ldots X_N$ shells can be a continuous film of the $X_2 \ldots X_N$ materials.

4. The method according to claim 1, wherein one or more of the $X_2 \ldots X_N$ shells can be a discontinuous film of the $X_2 \ldots X_N$ materials.

5. The method according to claim 4, wherein the discontinuous film can comprise nanoparticles or islands of any one or more of the $X_2 \ldots X_N$ materials.

6. The method according to claim 1, wherein all processing steps are conducted in a controlled atmosphere with air-free transfer between steps to provide clean interfaces within the bipolar nanocomposite semiconductor.

7. The method according to claim 1, wherein the $X_1/X_2 \ldots X_N$ nanoparticles include nanoparticles having a core or a shell formed from SnSe, $Bi_2Te_3$, a Bi—Te alloy, a BiSbTe alloy, $Bi_2T_3/CdTe$ a Zn—Sb alloy, Si, Ge, SiGe, $Mg_2Si$, $SrTiO_3$, $NaCo_2O_4$, $Zn_4Sb_3$, a Co—Sb alloy, or ZnO.

8. The method according to claim 1, wherein $Y_1$ comprises SiC, $Al_2O_3$, $ZrO_2$, $HfO_2$, $SiO_2$, $Gd_2Zr_2O_7$, $(Zr,Hf)_3Y_3O_{12}$, $Si_3N_4$, AlN, ScN, MgF, CaF, ZnF, AlP, $SiS_2$, LiCl, NaCl, $MgCl_2$, or $CaCl_2$.

9. The method according to claim 1, wherein the porous green compact is formed by pressing the nanopowder of the first material $X_1/X_2 \ldots X_N$.

10. The method according to claim 1, wherein the porous green compact is formed by pre-sintering of the first material $X_1/X_2 \ldots X_N$.

11. The method according to claim 1, wherein the step of infilling and conformally coating all available surfaces inside the porous compact of the first material $X_1/X_2 \ldots X_N$ with the second material is interrupted while the compact retains an open porosity and the step of infilling is repeated with an additional material $Y_2$.

12. The method according to claim 1, wherein at least one of $Y_1, Y_2 \ldots Y_N$ comprises nanoparticles or islands of $Y_1, Y_2, \ldots, Y_N$ materials.

13. The method according to claim 1, wherein the first material comprises core/shell particles having at least one length dimension of less than 3 nm.

14. The method according to claim 1, wherein the TE nanocomposite material comprises an interconnected particle network of nanocrystals or nanocrystallites having a crystal size of about 1 nm to about 800 nm.

15. The method according to claim 1, wherein the second material has at least one length dimension of less than 3 nm.

16. The method according to claim 1, wherein the second material has at least one length dimension of about 1 nm to about 800 nm.

17. The method according to claim 1, wherein the $X_1/X_2 \ldots X_N$ nanoparticles comprise $X_1/X_2$ nanoparticles wherein $X_1$ comprises $Bi_2Te$ and $X_2$ comprises CdTe.

18. The method according to claim 1, wherein the process of infilling and conformally coating all available surfaces inside the porous compact of the first material $X_1/X_2 \ldots X_N$ includes N steps of infilling and coating all available surfaces inside the porous compact of material $X_1/X_2 \ldots X_N$ with materials $Y_1, Y_2, \ldots, Y_N$ which are repeated while the compact retains an open porosity.

19. The method according to claim 18, wherein one or more of the conformal $Y_1, Y_2, \ldots, Y_N$ materials comprises a continuous film.

20. The method according to claim 18, wherein the N steps of infilling and conformally coating all available surfaces inside the porous compact of material $X_1/X_2 \ldots X_N$ with materials $Y_1, Y_2, \ldots, Y_N$ are realized by means of atomic layer deposition.

\* \* \* \* \*